(12) United States Patent
Jayaraj et al.

(10) Patent No.: US 10,418,989 B2
(45) Date of Patent: Sep. 17, 2019

(54) ADAPTIVE BODY BIASING IN CMOS CIRCUITS TO EXTEND THE INPUT COMMON MODE OPERATING RANGE

(71) Applicant: Exar Corporation, Fremont, CA (US)

(72) Inventors: Vinit Jayaraj, Fremont, CA (US); Pekka Ojala, Fremont, CA (US); John Tabler, Fremont, CA (US)

(73) Assignee: Exar Corporation, Fremont, CA (US)

(*) Notice: Subject to any disclaimer, the term of this patent is extended or adjusted under 35 U.S.C. 154(b) by 0 days.

(21) Appl. No.: 16/160,552

(22) Filed: Oct. 15, 2018

(65) Prior Publication Data

US 2019/0052261 A1 Feb. 14, 2019

Related U.S. Application Data

(63) Continuation of application No. 15/474,791, filed on Mar. 30, 2017, now Pat. No. 10,103,728.

(51) Int. Cl.
*H03K 3/01* (2006.01)
*H03K 17/16* (2006.01)
*H03K 17/30* (2006.01)
*H03K 17/06* (2006.01)

(52) U.S. Cl.
CPC ......... *H03K 17/302* (2013.01); *H03K 17/063* (2013.01); *H03K 2217/0018* (2013.01)

(58) Field of Classification Search
CPC .............. H03K 17/302; H03K 17/063; H03K 2217/0018
See application file for complete search history.

(56) References Cited

U.S. PATENT DOCUMENTS

| | | | | |
|---|---|---|---|---|
| 6,281,735 B1 * | 8/2001 | Page | ................ | H03K 3/3565 |
| | | | | 327/180 |
| 7,728,649 B1 * | 6/2010 | Webb | ................ | H03K 17/165 |
| | | | | 327/404 |
| 10,103,728 B1 * | 10/2018 | Jayaraj | ................ | H03K 17/302 |
| 2010/0165607 A1 * | 7/2010 | Russo | ................ | F21S 8/02 |
| | | | | 362/147 |
| 2014/0002144 A1 * | 1/2014 | Hatakeyama | ...... | H03K 19/0027 |
| | | | | 327/108 |

* cited by examiner

*Primary Examiner* — Kenneth B Wells
(74) *Attorney, Agent, or Firm* — McAndrews, Held & Malloy

(57) ABSTRACT

In order to get the best of both high and low common mode ranges, an adaptive body biasing method using a pair of replica devices is implemented. Each replica device corresponds to a NMOS (or PMOS) device that constitutes the input pair used in a logic circuit or other type of integrated circuits. This configuration helps to increase the threshold voltage of the device, utilizing body effect, at high input common mode voltage, as desired for NMOS, and at low input common mode voltage, as desired for PMOS. At the same time, this configuration scales the threshold back to normal at low input common mode voltages, thereby countering the negative impact of body effect. In short, the body bias applied to the NMOS (or PMOS) device helps in adapting the threshold voltage to the operating condition.

36 Claims, 7 Drawing Sheets

ADAPTIVE BODY BIASING IN CMOS CIRCUITS TO EXTEND THE INPUT COMMON MODE OPERATING RANGE

CLAIM OF PRIORITY

This patent application is a continuation of application Ser. No. 15/474,791 filed on Mar. 30, 2017, now U.S. Pat. No. 10,103,728 which is hereby incorporated herein by reference in its entirety.

BACKGROUND

Technical Field

Described are methods and apparatus for biasing integrated circuit devices to extract desired performance range.

Brief Description of the Prior Art

In a typical Complementary Metal Oxide Semiconductor (CMOS) circuit having an input stage comprising negative-channel MOS (NMOS) devices or positive-channel MOS (PMOS) devices, the maximum or minimum input common mode voltage is determined by the threshold voltage of the NMOS or PMOS.

In the case of an NMOS input pair, to achieve a high common mode input range, the body of the NMOS input pair is typically connected to Ground (GND) or the lowest voltage ($V_{SS}$) in order to raise the threshold voltage through body effect. The body effect is the change in threshold voltage of a transistor due to the voltage difference between the source and bulk (substrate) of the transistor device. Connecting the body of the input pair NMOS devices to Ground has a negative impact in that the low common mode input range is sacrificed and the NMOS devices will turn off earlier as the input common mode voltage is decreased.

In the case of a PMOS input pair, to achieve a low common mode input range, the body of the PMOS input pair is typically connected to Supply or highest voltage (VCC) in order to raise the threshold voltage through body effect. This has a negative impact in that the high common mode input range is sacrificed and the PMOS devices will turn off earlier as the input common mode voltage is increased.

SUMMARY

A biasing scheme is required in NMOS and PMOS input devices to counter the known problem of early turn-off described above so that devices can be operated in a wider operating range of common mode voltage. Additionally, the biasing scheme should be such that small signal source-body voltage of the NMOS or PMOS devices would not detrimentally affect the input device's gain.

In order to get the best of both high and low common mode ranges, an adaptive body biasing method using a pair of replica devices is implemented. Each replica device corresponds to a NMOS (or PMOS) device that constitutes the input pair used in an integrated circuit, such as differential pair circuit, operational amplifier, comparator, amplifying gain stages etc. The replica device is chosen so that the intrinsic device parameters and dimensions of the replica device match as closely as possible with the parameters and dimensions of the corresponding NMOS (or PMOS) device. In order to bias the input device's body independently of the source and substrate potentials, the device is built in an isolated well structure of the process. The replica device will also use an isolated well structure to closely match the input device electrical behavior. The body bias applied to the NMOS (or PMOS) device helps in adapting the threshold voltage to the operating condition. Embodiments of this disclosure help to increase the threshold voltage of the device, utilizing body effect, at high input common mode voltage, as desired for NMOS, and at low input common mode voltage, as desired for PMOS. At the same time, the embodiments scale the threshold back to normal at low input common mode voltages, thereby countering the negative impact of body effect.

BRIEF DESCRIPTION OF THE DRAWINGS

These and other aspects and features of the present disclosure will become apparent to those ordinarily skilled in the art upon review of the following description of specific embodiments of the disclosure in conjunction with the accompanying figures, wherein.

DETAILED DESCRIPTION

Embodiments of the present disclosure will now be described in detail with reference to the drawings, which are provided as illustrative examples of the disclosure so as to enable those skilled in the art to practice the disclosure. Notably, the figures and examples below are not meant to limit the scope of the present disclosure to a single embodiment, but other embodiments are possible by way of interchange of some or all of the described or illustrated elements.

Moreover, where certain elements of the present disclosure can be partially or fully implemented using known components, only those portions of such known components that are necessary for an understanding of the present disclosure will be described, and detailed descriptions of other portions of such known components will be omitted so as not to obscure the disclosure.

In the present specification, an embodiment showing a singular component should not be considered limiting; rather, the disclosure is intended to encompass other embodiments including a plurality of the same component or nested stages, and vice-versa, unless explicitly stated otherwise herein. Moreover, applicants do not intend for any term in the specification or claims to be ascribed an uncommon or special meaning unless explicitly set forth as such. Further, the present disclosure encompasses present and future known equivalents to the known components referred to herein by way of illustration.

Figure 1:
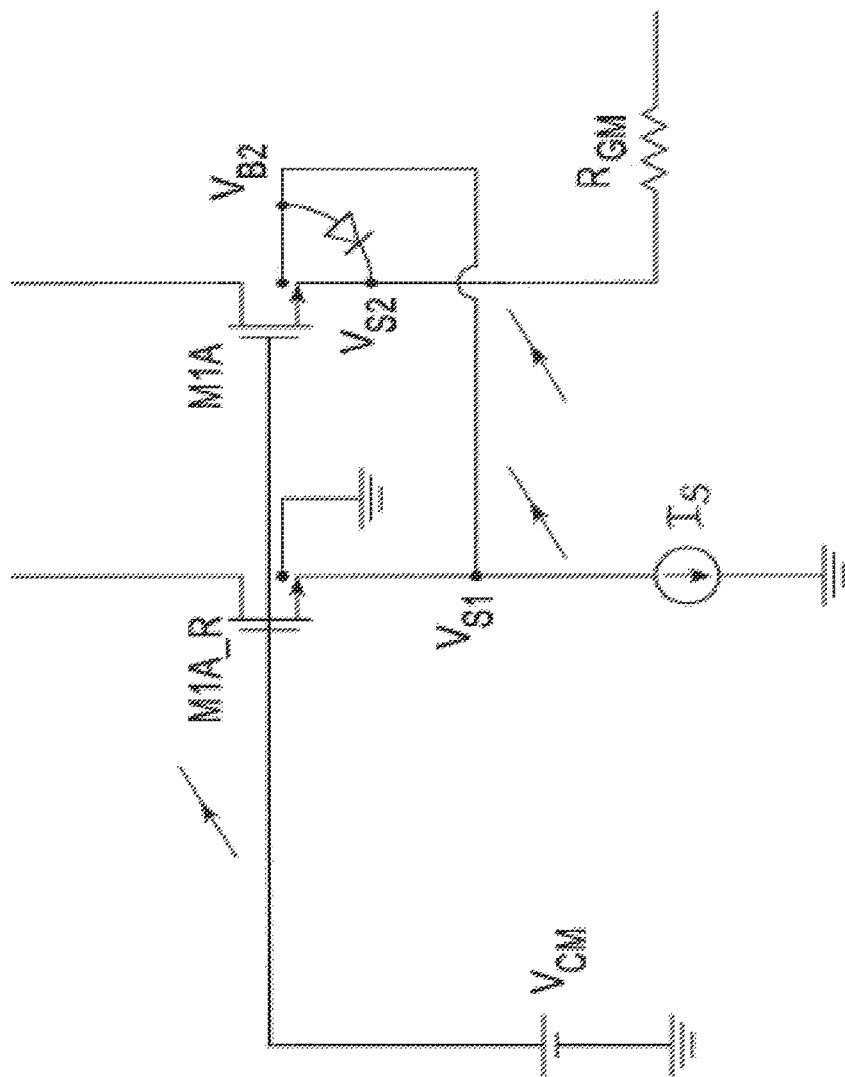
FIG. 1 is a schematic of a circuit demonstrating the large signal advantage of adaptive body biasing, according to an embodiment.

Referring to FIG. 1, a schematic is shown demonstrating the large signal advantage of adaptive body biasing. The schematic in FIG. 1 is shown for an NMOS input pair case, but a similar circuit configuration can be used for a PMOS input pair case as well, though the common mode voltage requirement would be different when PMOS devices are used rather than NMOS devices. FIG. 1 describes the DC operating input common mode voltage (VCM) range for large signal operation, where voltages are described with an upper case 'V.' Also, it is to be noted that only one NMOS device (with its corresponding replica device) of the input pair is shown for simplicity. Persons skilled in the art would understand that another NMOS device (and its corresponding replica device) would complete the input stage. A plurality of devices in parallel, or additional nested devices forming a hierarchy of stages can be used as well.

In FIG. 1, M1A is one of the NMOS devices in the main input pair. M1A_R is the replica device. Use of this replica device (and body effect on this replica device) is a unique feature of this disclosure. Note that the body of the replica device M1A_R is tied to ground whereas the body of M1A is driven by the source of M1A-R. The body effect of MOSFET changes the device's threshold voltage Vth as the following equations:

$$V_{th} = V_{TO} + \gamma(\sqrt{V_{SB} + 2\phi_F} - \sqrt{2\phi_F})$$ (Eq 1), where $$\gamma = \sqrt{2\epsilon_s q N_A}/C_{ox}$$ (Eq 2)

In the first equation above, VTO indicates threshold voltage when VSB is zero, γ indicates the body effect coefficient set by material parameters, and ΦF is a constant whose value depends on the manufacturing process doping concentration of device bulk region and temperature. In the second equation above, q indicates electric charge, εS indicates dielectric constant of semiconductor, NA indicates acceptor concentration, and Cox indicates oxide capacitance per unit area. It is to be noted that since M1A_R is a replica device of M1A, the device parameters, such as VTO, γ etc. match between M1A_R and M1A. In general, the replica device is chosen so that the intrinsic device parameters and dimensions of the replica device match as closely as possible with the parameters and dimensions of the corresponding main NMOS (or PMOS) device in the circuit. The only parameter that is changing is the source-body voltage VSB of M1A in order to control threshold voltage via change in VSB. Therefore, over process and temperature variation, the matching between M1A_R and M1A remains substantially intact. In general, the replica device is built using commonly used layout matching techniques to replicate the geometry, layer stack, surrounding environment and electrical behavior of the input device as closely as possible when bias-points voltages at terminals match. The replica device is commonly placed in immediate vicinity of the input device in order to reduce the effect of the silicon material parameters variation across space between devices. Both input device and replica device are built in isolated well structures in order to enable bulk region biasing independent of substrate potential.

The gates of M1A_R and M1A are connected to the same input voltage. In this schematic, the gates are connected to a common mode voltage of VCM. M1A_R is biased as a source follower with a constant current source. IS is the DC bias current. Body effect on M1A_R is utilized on purpose to have VS1 change non-linearly as VCM changes.

At low VCM, source voltage VS1 of the replica device will be closer to VCM. As shown in FIG. 1, body voltage VB2 of M1A is tied to the source voltage VS1 of replica device M1A_R. Threshold voltage increase on M1A is minimized by driving its body voltage VB2 closer to its source voltage VS2. This means VS1 is approximately equal to VS2. Under this operating condition, (VS2-VB2) is small, implying that VCM can go lower and only limited by the intrinsic threshold voltage (VTH~VTO) of M1A and is not altered by the body effect.

Figure 2:
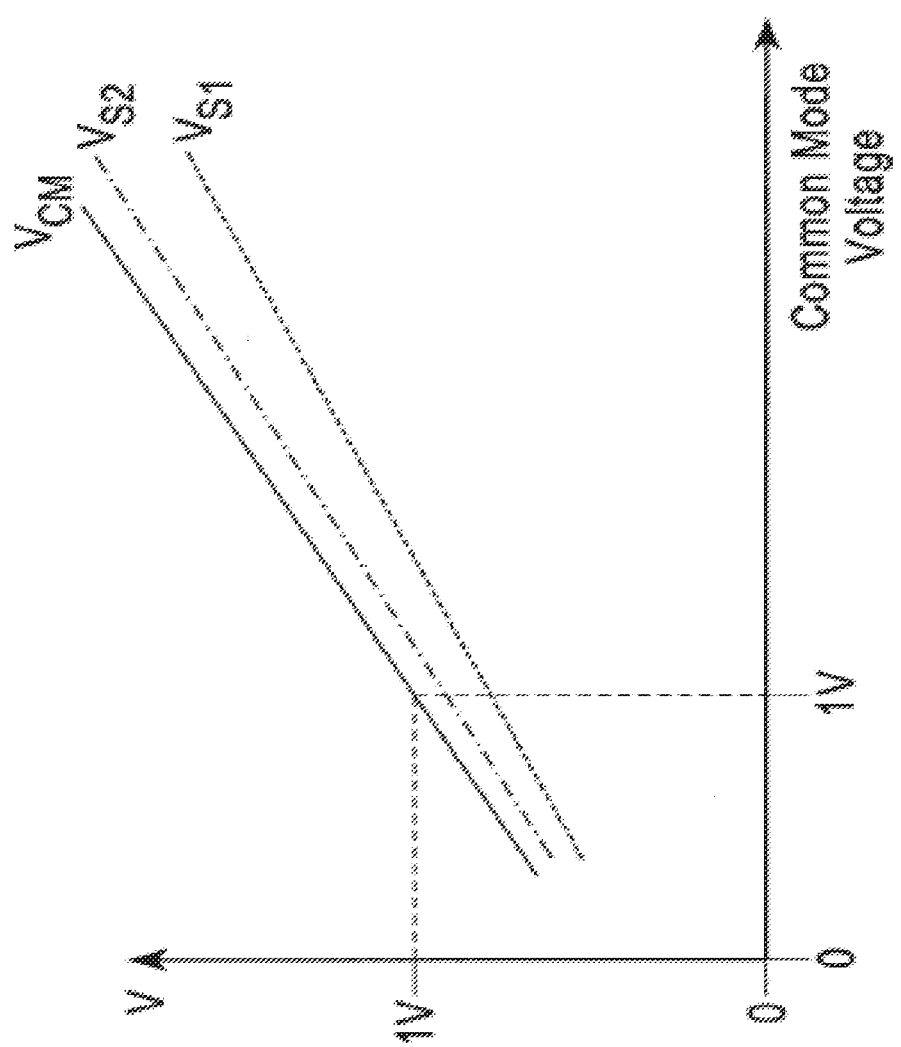
FIG. 2 is a plot showing the DC variation of common mode voltage in the large signal configuration shown in FIG. 1, as well as how Vs1 and Vs2 change with respect to the common mode voltage.

FIG. 2 shows the variation of VS1 and VS2 from a low common mode voltage range to a high common mode voltage range, with respect to reference common mode voltage VCM. At high VCM, VS1 diverges from VCM further and (VCM-VS1) increases due to body effect, as shown in FIG. 2. Since VS1 gets relatively lower compared to VCM, as VCM increases, (VS2-VB2) increases, the body effect on M1A increases and the effective threshold voltage of M1A increases. This increases the high common mode range on VCM and M1A will stay in saturation even at high VCM. VS2 largely follows VCM while VS1 deviates from it.

In short, the advantage of adaptive body biasing for large signal is that, at low VCM, threshold increase of M1A is minimized by driving its body to be close to its source, i.e. keeping (VS2-VB2) small, thereby improving low VCM range. At high VCM, since body of M1A_R is at GND, VS1 diverges from VS2, increasing (VS2-VB2) and increasing the threshold of M1A, thereby improving high common mode voltage range.

Figure 3:
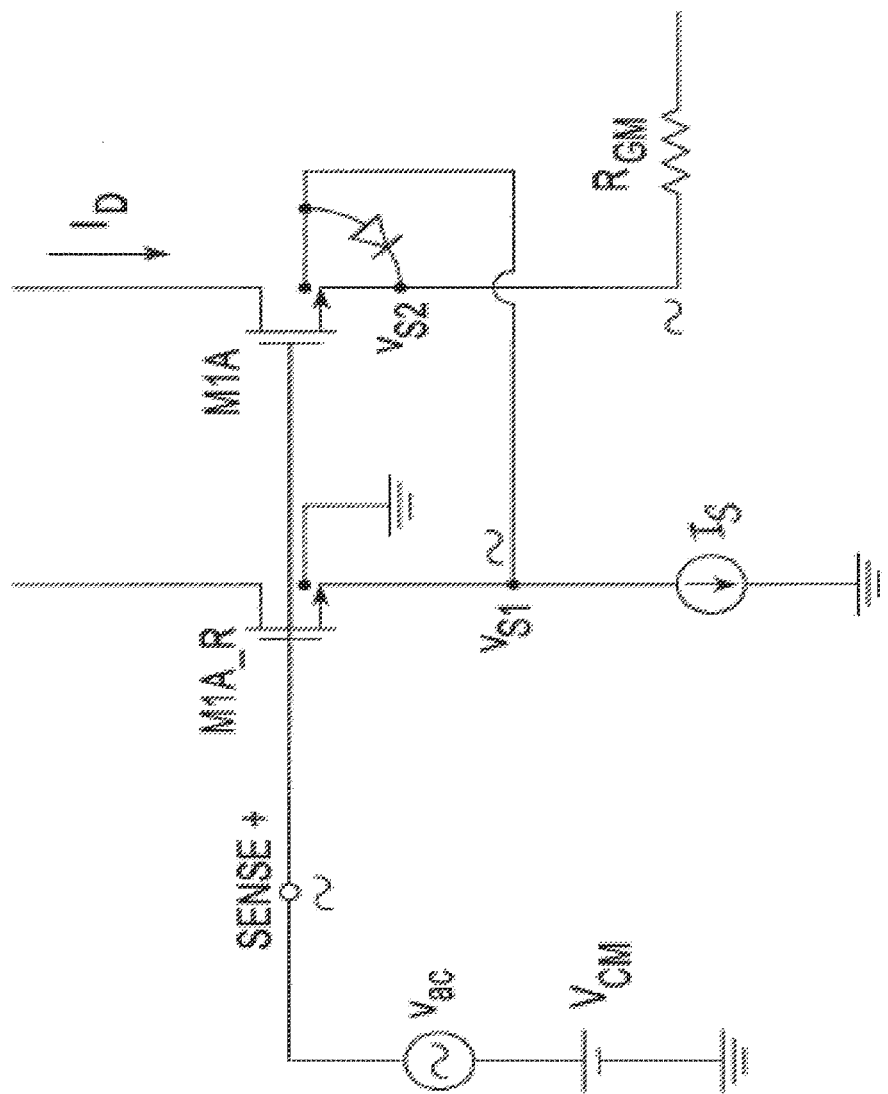
FIG. 3 is a schematic of a circuit demonstrating the small signal advantage of adaptive body biasing, according to an embodiment.
Figure 4:
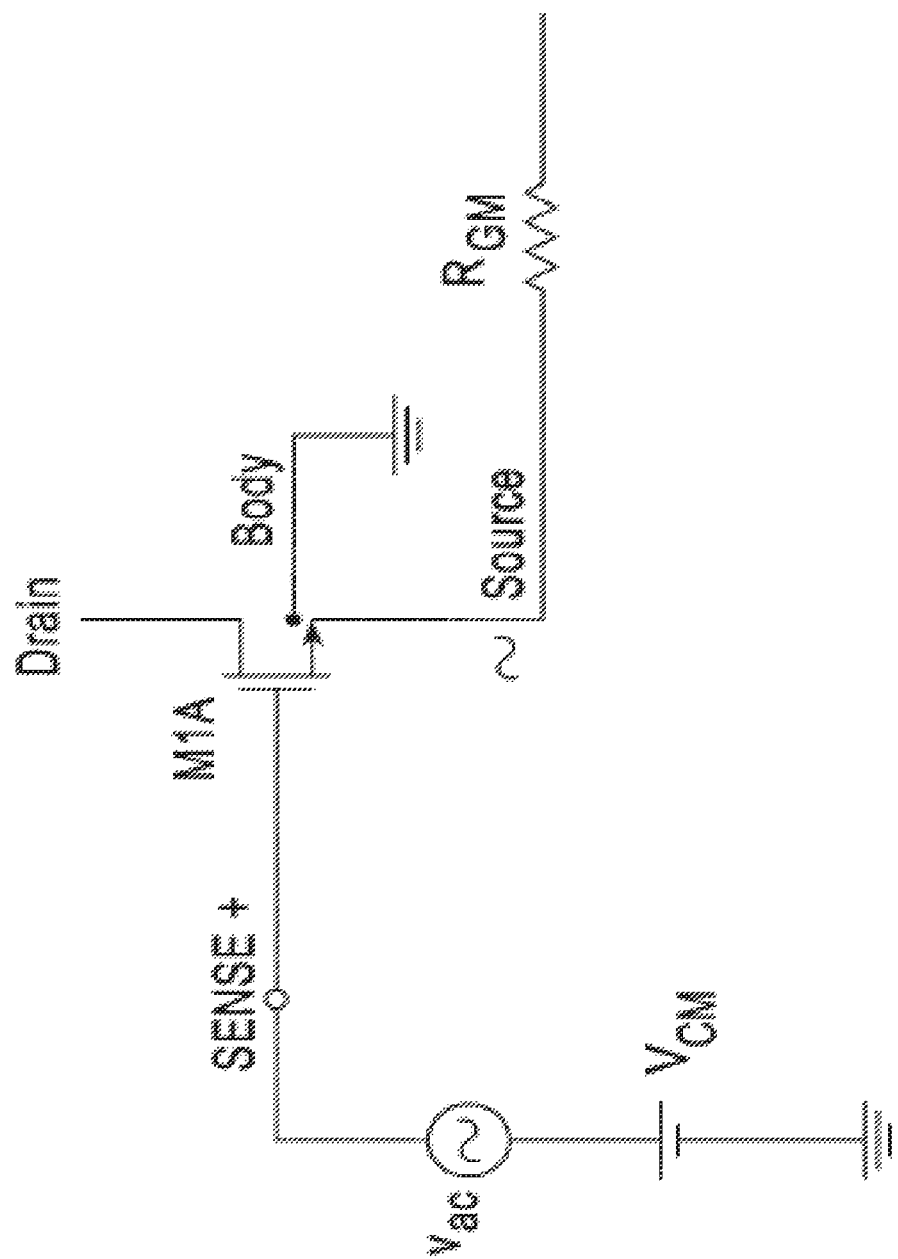
FIG. 4 shows the NMOS source follower small-signal equivalent circuit that can be used to calculate the gain of a stage, according to an embodiment.
Figure 5:
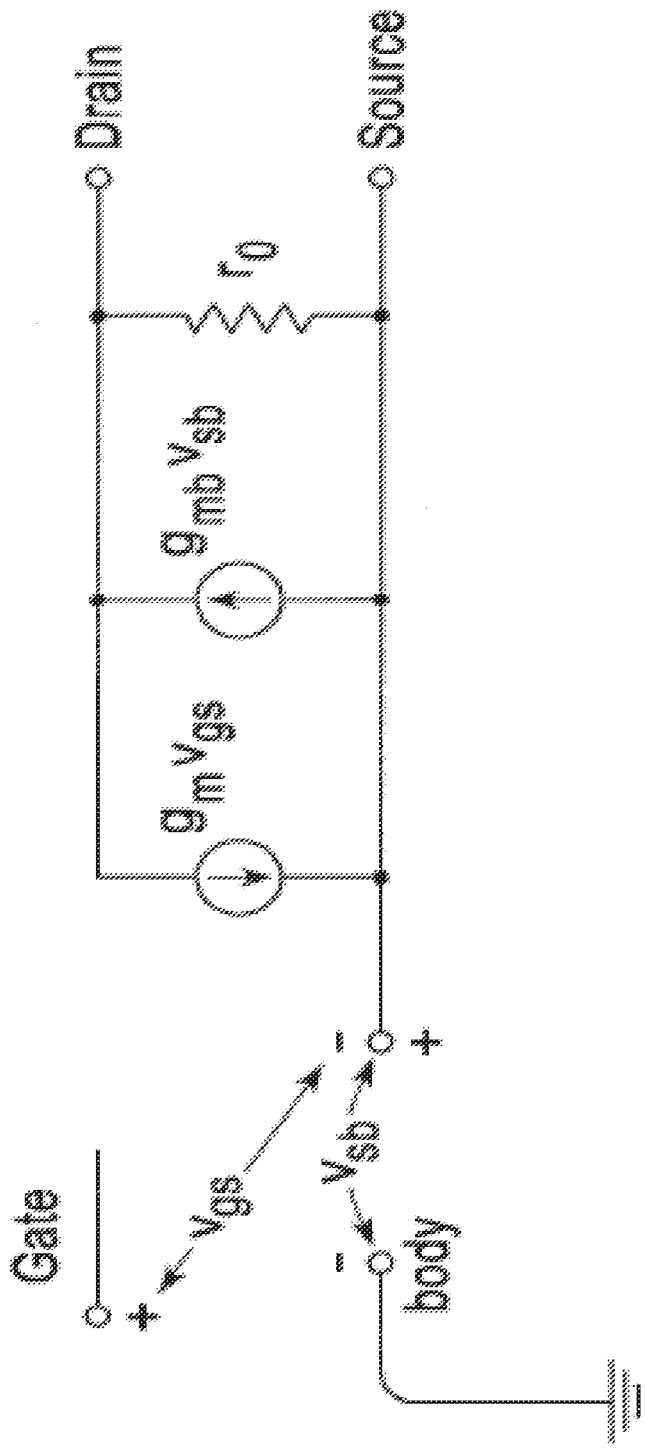
FIG. 5 shows an AC small signal model of the gain stage source follower circuit shown in FIG. 4.

Referring to FIG. 3, a schematic is shown demonstrating the small signal advantage of adaptive body biasing for the same circuit shown in FIG. 1. Specifically, FIG. 3 is shown to analyze the effect of body effect in the ac small signal domain. As described above, the schematic is shown for an NMOS input pair case, but can be applied to a PMOS input pair case as well. The small signal voltages are described with a lower case 'v,' for example, vac. FIG. 4 shows the AC small signal voltages of a gain stage source follower circuit of prior art, i.e. without the replica device. FIG. 5 shows an AC small signal model of the circuit shown in FIG. 4.

In FIG. 3, VCM is the input DC common mode input as described with reference to FIGS. 1 and 2, vac is the AC small signal applied to the differential input pair. The SENSE+ voltage is used to calculate current flowing through RGM, as described below with respect to FIG. 6. As SENSE+ voltage moves with vac, source voltage vs1 of the replica device M1A_R moves and source voltage vs2 of the input pair NMOS device M1A also moves. Since vs1 and vs2 move in tandem, the small signal source-body voltage vsb of M1A, which is equal to (vs2-vs1), is small or negligible. Hence the (gmb.vsb) current source (shown in FIG. 5) in the small signal model of M1A disappears or will have negligible effect on the small signal gain perspective. As obvious to persons skilled in the art, gmb is the body transconductance used to model the current source in the small signal model taking body effect into account.

For small signal, the ideal condition is to make vsb of M1A equal to zero. To make body bias vsb of M1A small, [i.e., to meet the condition vsb (M1A)=(vs2-vs1)~small], the following condition has to be met:

$$\left(\frac{g_{mb}}{g_m}\right)_{M1A} = \left(\frac{2}{R_{GM}}\right) \cdot \left(\frac{1}{g_m}\right), \text{ where}$$ (Eq. 3)

-continued $$g_m = \sqrt{2 \cdot I_D \cdot \beta \cdot \frac{W}{L}} \quad \text{(Eq. 4)}$$

$$g_{mb} = \frac{\gamma \cdot g_m}{2 \cdot \sqrt{-2\phi - V_{BS}}} \quad \text{(Eq. 5)}$$

$$\beta = \mu \cdot C_{ox} \quad \text{(Eq. 6)}$$

Here, transconductances gm and gmb are respectively the front-gate transconductance and back gate transconductance of M1A. RGM is the load. In the equations above, μ indicates mobility, W indicates width of transistor M1A, L indicates length of transistor M1A, Cox, ϕ and γ are already defined above.

When vsb (M1A)=(vs2−vs1) is small, (gmb−vsb) current source in the small signal model has almost no effect. This means the applied vac effectively falls across RGM, making the following approximation true, where Gm is the total gain of the stage.

$$G_m \cong \frac{1}{R_{GM}} \quad \text{(Eq. 7)}$$

Figure 6:
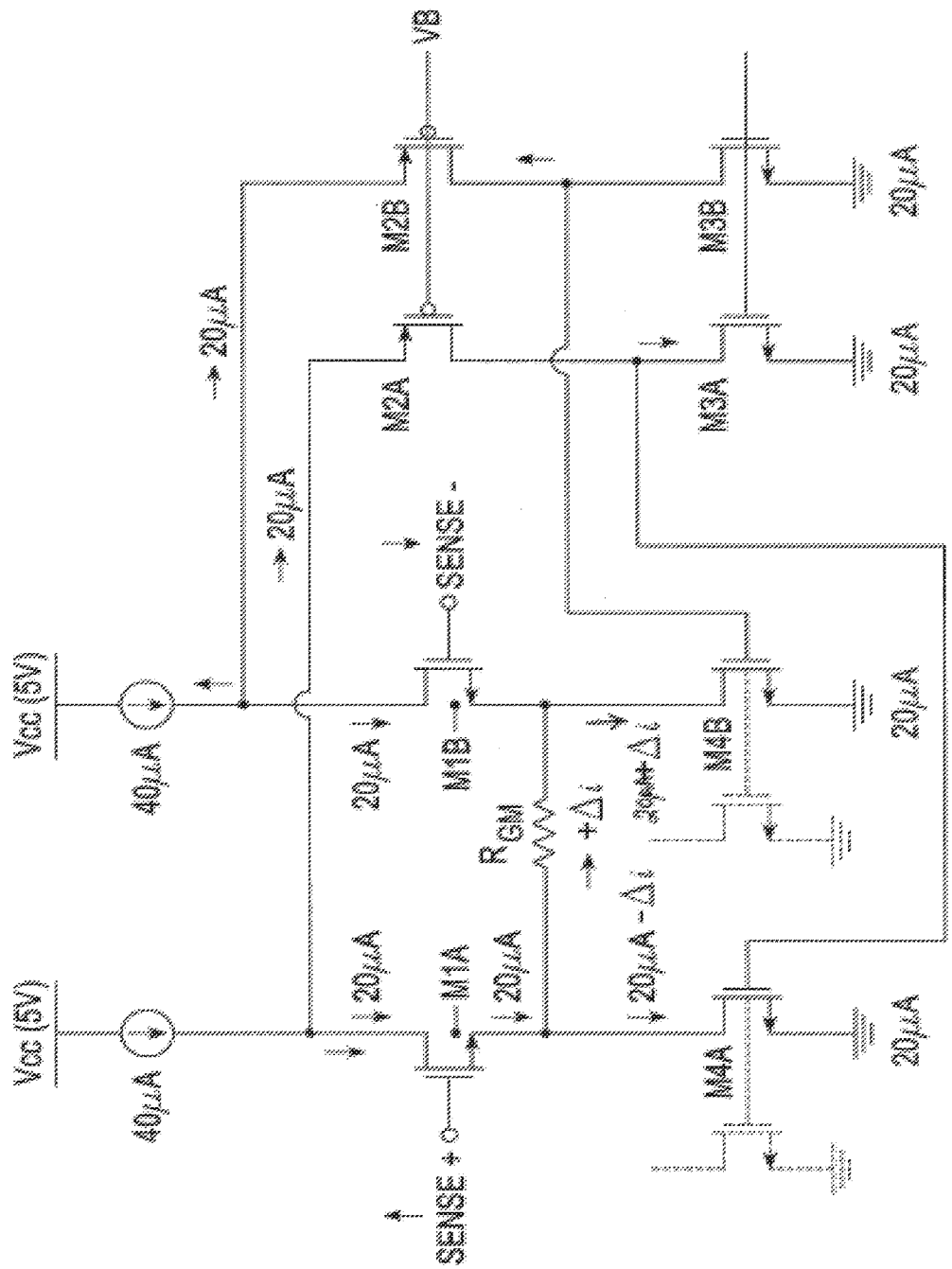
FIG. 6 shows an example circuit topology where the body biasing scheme of the present disclosure can be applied.

FIG. 6 shows an example current sense circuit where the inventive concept can be applied. In FIG. 6 $M_{1A}$ and $M_{1B}$ are the main devices of a differential amplifier. The unconnected stubs for $M_{1A}$ and $M_{1B}$ are the body connections, which can be driven by the replica devices disclosed herein, as shown in FIGS. 1, 3 and 4. In FIGS. 1, 3 and 4, the other half of a differential pair with $M_{1B}$ is not shown for simplicity and clarity, since the circuit is symmetric with respect to $M_{1A}$ and $M_{1B}$.

Persons skilled in the art would appreciate that the disclosure is not limited to the example circuit shown in FIG. 6, which is merely an example of how the bodies of $M_{1A}$ and $M_{1B}$ can be driven by the replica devices. There exist many other circuit topologies where the replica device idea can be used. We can use the example circuit of FIG. 6 to calculate the gain $G_m$ in Equation 7, as shown below:

$$v_{ac} = (\text{SENSE}^+ - \text{SENSE}^-) \quad \text{(Eq 8)}$$

Therefore $$\Delta i = \frac{(\text{SENSE}^+ - \text{SENSE}^-)}{R_{GM}} = \frac{V_{ac}}{R_{GM}} \quad \text{(Eq. 9)}$$

Hence, total gain of the stage, $$G_m = \frac{\Delta i}{V_{ac}} = \frac{1}{R_{GM}} \quad \text{(Eq. 10)}$$

The gain calculation formula of Eq. 10 holds true for the circuits shown in FIGS. 1, 3 and 4, as discussed above and shown in Equation 7, only when the input devices are driven by replica devices. Typically, without the replica devices, as the common mode voltage increases, $M_{1A}$ and $M_{1B}$ experience larger $V_{SB}$ (assuming body=ground in the absence of the replica devices). This increases the threshold voltage, as shown by Eq. 1. Also, as $v_{sb}$ increases, $g_{mb}$ decreases, as shown by Eq. 5. Therefore, without the replica devices, the approximation of Eq. 7 would not hold true because of the effect of the ($g_{mb}$−$v_{sb}$) current source that comes into play. Replica devices prevent the current source to negatively affect the gain of the input devices. Persons skilled in the art would appreciate that the voltage and current values shown in the circuit of FIG. 6 are merely non-limiting example values, and other values may be used depending on the circuit topology.

Figure 7:
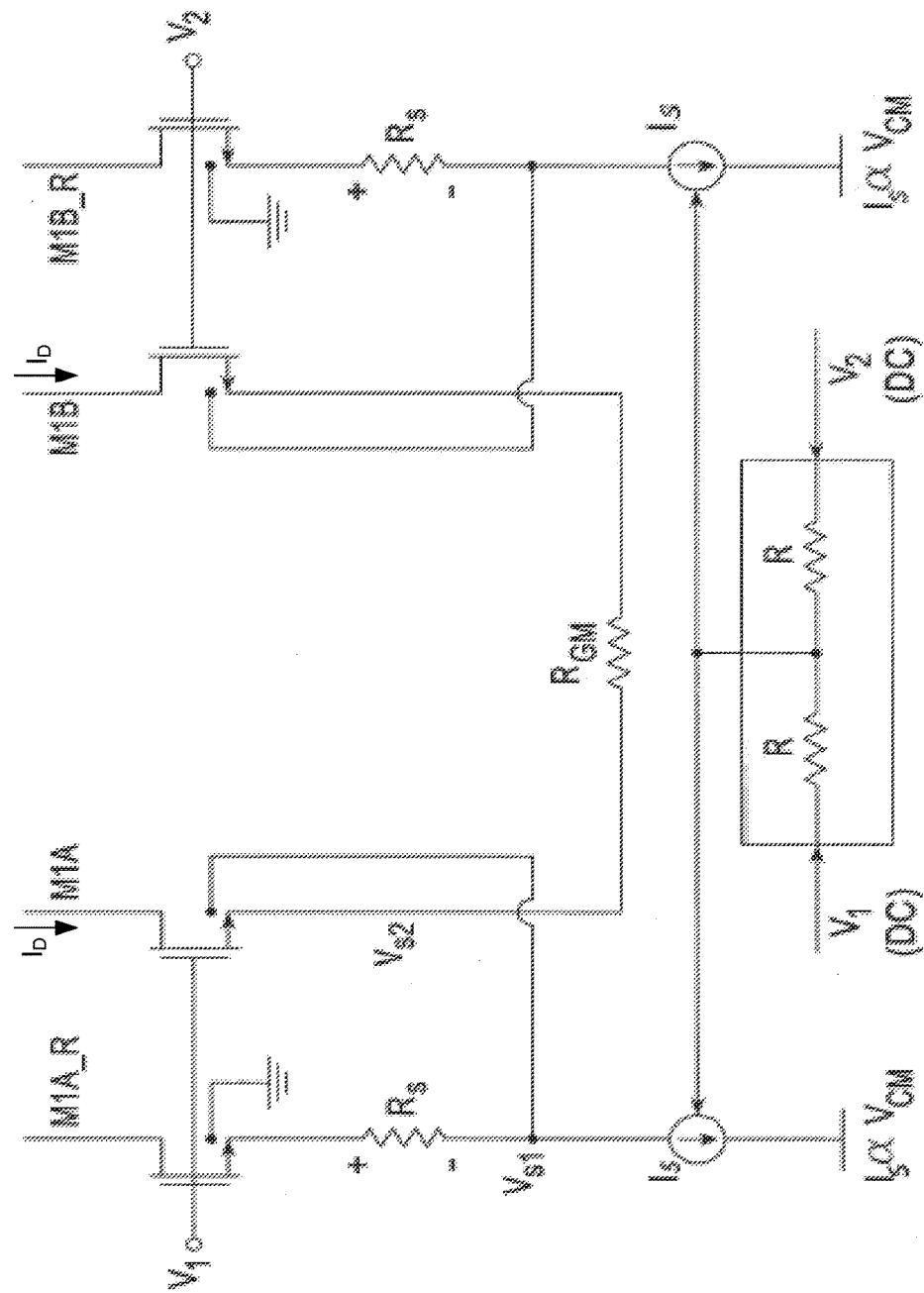
FIG. 7 shows an example circuit where threshold voltage of transistors increases with common mode voltage not just by body effect, but also by a drop across a source resistor.

FIG. 7 shows another example circuit for demonstrating how using source resistors RS for the replica devices M1A-R (corresponding to the first transistor M1A of the differential pair) and M1B-R (corresponding to the second transistor M1B of the differential pair) helps threshold voltage tuning. The main idea is to increase the value of IS in the current source as a function of common mode DC input voltage VCM. As VCM increases, IS also increases, so drop across source resistors RS also increases. Consequently, VS1 decreases as a function of VCM. Therefore, threshold voltage of M1A increases with VCM not just by body effect of M1A_R and M1B_R but also by drop across the source resistors RS. In the above circuit, voltages V1 and V2 are equivalent to the SENSE+ and SENSE− voltages shown in FIG. 6. In an alternative embodiment, one may choose to not use RS, and only use current proportional to VCM to control VGS of M1A_R and M1B_R which increases as a function of square root of the current. A resistor divider can be used as the common mode detector with the mid-point of the resistor divider being equal to VCM.

Although the present disclosure has been particularly described with reference to the preferred embodiments thereof, it should be readily apparent to those of ordinary skill in the art that changes and modifications in the form and details may be made without departing from the spirit and scope of the disclosure. It is intended that the appended claims encompass such changes and modifications.

What is claimed is:

1. A method for amplification in an input circuit, the method comprising:
   in an input stage comprising an input device with a replica device between the input device and an input voltage, the input voltage coupled to gate terminals of the input device and the replica device, wherein a body of the replica device is connected to ground and a source of the replica device is connected to a body of the input device:
   driving the body of the input device by the source of the replica device, wherein:
   a change in a voltage of the source of the replica device with respect to a common mode voltage is used to tune a threshold voltage of the input device;
   the source of the replica device is driven by a current source with a current value proportional to the common mode voltage; and
   a drop across a source resistor of the replica device controls a threshold voltage of the input device in conjunction with body effect of the replica device.

2. The method of claim 1, wherein a voltage difference between the source of the replica device and a source of the input device increases due to body effect of the replica device, as the common mode voltage increases, resulting in the voltage change that is used to tune the threshold voltage of the input device.

3. The method of claim 1, wherein the step of driving includes:
keeping a voltage difference between the source and the body of the input device to a value varying between the threshold voltage and $V_{cc}$, thereby minimizing an increase of the threshold voltage due to body effect of the input device.

4. The method of claim 1, wherein the step of driving includes:
increasing a voltage difference between a source and the body of the input device to a value varying between a saturation voltage and the threshold voltage, thereby allowing the threshold voltage to increase due to body effect of the input device.

5. The method of claim 1, wherein the input device and the replica device are both negative-channel metal oxide semiconductor (NMOS) devices.

6. The method of claim 1, wherein the input device and the replica device are both positive-channel metal oxide semiconductor (PMOS) devices.

7. The method of claim 1, wherein the input device is one of a pair of input devices comprising the input stage of a complementary metal oxide semiconductor (CMOS) circuit.

8. The method of claim 1, wherein the replica device comprises a source follower coupled to a constant current source.

9. A circuit for amplification, the circuit comprising:
an input stage comprising an input device with a replica device between an input voltage and the input device, wherein a body of the replica device is connected to ground, a source of the replica device is connected to a body of the input device, and a gate of the replica device is connected to the input voltage to which a gate of the input device is also connected, wherein:
the body of the input device is driven by the source of the replica device;
a change in a voltage of the source of the replica device with respect to a common mode voltage is used to tune a threshold voltage of the input device;
the input device is one of a pair of input devices comprising the input stage of the circuit;
the input stage is one of a plurality of input stages; and
the plurality of input stages are nested hierarchically.

10. The circuit of claim 9, wherein a voltage difference between the source of the replica device and a source of the input device increases due to a body effect of the replica device, as the common mode voltage increases, resulting in the voltage change that is used to tune the threshold voltage of the input device.

11. The circuit of claim 9, wherein a voltage difference between a source and the body of the input device is configured to minimize an increase of the threshold voltage due to body effect of the input device.

12. The circuit of claim 11, wherein the voltage difference is kept at a value that varies between the threshold voltage and $V_{cc}$.

13. The circuit of claim 9, wherein a voltage difference between a source and the body of the input device is increased at a high end of a common mode voltage range, thereby allowing the threshold voltage to increase due to body effect of the input device.

14. The circuit of claim 13, wherein the voltage difference is kept at a value that varies from a saturation voltage to the threshold voltage.

15. The circuit of claim 9, wherein the input device and the replica device are both negative-channel metal oxide semiconductor (NMOS) devices.

16. The circuit of claim 9, wherein the input device and the replica device are both positive-channel metal oxide semiconductor (PMOS) devices.

17. The circuit of claim 9, wherein the replica device comprises a source follower coupled to a constant current source.

18. The circuit of claim 9, wherein a gain of the input device is not detrimentally affected by the replica device.

19. The circuit of claim 9, wherein the source of the replica device is driven by a current source with a current value proportional to the common mode voltage.

20. The circuit of claim 9, wherein a drop across a source resistor of the replica device controls the threshold voltage in conjunction with body effect of the replica device.

21. The circuit of claim 9, wherein intrinsic device parameters of the replica device substantially match with corresponding intrinsic device parameters of the input device.

22. The circuit of claim 9, wherein physical geometry, layer stack, surrounding environment and electrical behavior of the replica device substantially match with corresponding features of the input device.

23. The circuit of claim 9, wherein the replica device is adjacent to the input device in order to minimize effects of silicon material parameters variation across space between devices.

24. The circuit of claim 9, wherein both the input device and replica device are built in isolated well structures in order to enable bulk region biasing independent of substrate potential.

25. A circuit having an input stage, the input stage comprising:
an input device with a replica device between an input voltage and the input device, wherein a body of the replica device is connected to ground, a source of the replica device is connected to a body of the input device, and a gate of the replica device is connected to the input voltage to which a gate of the input device is also connected;
wherein:
the body of the input device is driven by the source of the replica device, wherein a change in a voltage of the source of the replica device with respect to a common mode voltage is used to tune a threshold voltage of the input device;
the source of the replica device is driven by a current source with a current value proportional to the common mode voltage; and
a drop across a source resistor of the replica device controls the threshold voltage in conjunction with body effect of the replica device.

26. The circuit of claim 25, wherein a voltage difference between the source of the replica device and a source of the input device increases due to body effect of the replica device, as the common mode voltage increases, resulting in the non-linear voltage change that is used to tune the threshold voltage of the input device.

27. The circuit of claim 25, wherein a voltage difference between a source and the body of the input device is configured to minimize an increase of the threshold voltage due to body effect of the input device.

28. The circuit of claim 27, wherein the voltage difference is kept at a value that varies between the threshold voltage and $V_{CC}$.

29. The circuit of claim 25, wherein a voltage difference between a source and the body of the input device is increased at a high end of the common mode voltage range, thereby allowing the threshold voltage to increase due to body effect of the input device.

30. The circuit of claim 29, wherein the voltage difference is kept at a value that varies from a saturation voltage to the threshold voltage.

31. The circuit of claim 25, wherein the input device and the replica device are both negative-channel MOS (NMOS) devices.

32. The circuit of claim 25, wherein the input device and the replica device are both positive-channel MOS (PMOS) devices.

33. The circuit of claim 25, wherein the replica device comprises a source follower coupled to a constant current source.

34. The circuit of claim 25, wherein a gain of the input device is not detrimentally affected by the replica device.

35. The circuit of claim 25, wherein the source of the replica device is driven by a current source with a current value proportional to the common mode voltage.

36. A method for amplification, the method comprising:
in an input stage comprising an input stage with a replica device between an input voltage and the input device, wherein a body of the replica device is connected to ground, a source of the replica device is connected to the body of the input device, and a gate of the replica device is connected to the input voltage to which a gate of the input device is also connected; and
driving the body of the input device by the source of the replica device, wherein a change in a voltage of the source of the replica device with respect to a common mode voltage is used to tune a threshold voltage of the input device, wherein:
the input device is one of a pair of input devices comprising the input stage of a complementary metal oxide semiconductor (CMOS) circuit;
the input stage is one of a plurality of input stages; and
the plurality of input stages are nested hierarchically.

* * * * *